United States Patent [19]
Liehr et al.

[11] Patent Number: 6,077,407
[45] Date of Patent: Jun. 20, 2000

[54] SPUTTERING CATHODE BASED ON THE MAGNETRON PRINCIPLE

[75] Inventors: Michael Liehr, Feldatal; Jörg Krempel-Hesse, Eckartsborn; Rolf Adam, Hanau, all of Germany

[73] Assignee: Leybold Systems GmbH, Hanau, Germany

[21] Appl. No.: 09/301,459

[22] Filed: Apr. 29, 1999

[30] Foreign Application Priority Data

May 4, 1998 [DE] Germany .............................. 198 19 785

[51] Int. Cl.⁷ ...................................................... H01J 37/34
[52] U.S. Cl. ................................. 204/298.19; 204/298.12; 204/298.16; 204/298.17; 204/298.02
[58] Field of Search ........................ 204/298.19, 192.12, 204/298.16, 298.17, 298.02, 298.18, 298.12

[56] References Cited

U.S. PATENT DOCUMENTS

| | | |
|---|---|---|
| 4,162,954 | 7/1979 | Morrison, Jr. . |
| 4,180,450 | 12/1979 | Morrison, Jr. ...................... 204/298.19 |
| 4,265,729 | 5/1981 | Morrison, Jr. ...................... 204/298.19 |
| 4,448,653 | 5/1984 | Wegmann .......................... 204/298.12 |
| 4,461,688 | 7/1984 | Morrison, Jr. . |
| 4,904,362 | 2/1990 | Gaertner et al. ................... 204/192.12 |
| 5,262,030 | 11/1993 | Potter . |
| 5,399,253 | 3/1995 | Grunenfelder ....................... 204/298.2 |
| 5,540,823 | 7/1996 | Fritsche .............................. 204/298.19 |

FOREIGN PATENT DOCUMENTS

| | | |
|---|---|---|
| 0316523 A2 | 8/1988 | European Pat. Off. . |
| 2434479 A1 | 3/1980 | France . |
| 2492163 A1 | 4/1982 | France . |

OTHER PUBLICATIONS

Patents Abstracts of Japan, C412 Mar. 26, 1987 vol., 11/No. 96.

Patent Abstract of Japan, Abstract for JP 8–232063A, Sep. 1996.

Patent Abstract of Japan, Abstract for JP 8–333680A, Dec. 1996.

*Primary Examiner*—Alan Diamond
*Attorney, Agent, or Firm*—Smith, Gambrell & Russell, LLP

[57] ABSTRACT

A sputtering cathode based on the magnetron principle, with a target of the material to be sputtered having a minimum of one component, with a magnetic system located beneath the target and having magnetic sources of different polarization which form a minimum of one self-enclosed tunnel of arcuate magnetic lines of force, having the poles of the sources facing away from the target connected to each other via a magnetic yoke made of a material of low retentivity, the bodies forming the sources of the magnetic fields being right prisms, and preferably right parallelepipeds, the base edges of which run parallel to the target plane, with the magnetic lines of force of the sources running at inclined angles relative to the base surfaces of the bodies.

13 Claims, 2 Drawing Sheets

SPUTTERING CATHODE BASED ON THE MAGNETRON PRINCIPLE

FIELD OF THE INVENTION

The subject matter of this invention relates to a sputtering cathode based on the magnetron principle, with the target of the material to be sputtered being at least one component, with a magnetic system located beneath the target and comprising sources of different polarization which form a minimum of one self-enclosed tunnel of arcuate magnetic lines of force, wherein the poles of the sources facing away from the target are connected to each other via a magnetic yoke made of a material of low retentivity.

BACKGROUND OF THE INVENTION

U.S. Pat. No. 4,461,688 teaches a sputtering cathode with a plate-shaped target and a plurality of U-shaped magnetic units located on the surface of the target facing away from the substrate. The front surfaces of the two legs of a first U-shaped magnetic unit lie close to the edges of the averted surface of the target, the front surfaces of the legs of a second pair of U-shaped magnetic units lie close to one half of the averted surface of the target, and the front surfaces of the two legs of additional pairs of smaller U-shaped magnetic units lie close to the external half of a portion of the averted surface of the target, which portion is overlapped by the second pair of magnetic units. This patent is incorporated herein by reference in its entirety.

A sputtering cathode is taught in U.S. Pat. No. 4,265,729 having magnets on the surface of the target facing away from the substrate which form a magnetic field, the bodies of the magnets being right prisms. The base edges are inclined with respect to the plane of the target, with the lines of force of the magnets running parallel to the flat edges, standing upright at the ends of the bodies. This patent is also incorporated herein by reference in its entirety.

SUMMARY OF THE INVENTION

It is an object of the invention to improve the target utilization of the planar sputtering cathodes and thus reduce coating costs and increase tool life.

Another object of the invention is to avoid coating the claw strips, which affix the targets to the base plate, with a coating material to ensure that arcing and contamination of the substrate from peeling coating material are prevented.

DETAILED DESCRIPTION OF THE INVENTION

The problems set out above are solved according to the present invention by providing bodies that form the source of the magnetic fields which are right prisms, and preferably right parallelepipeds. The base edges of the bodies run parallel to the plane of the target, and the magnetic lines of force of the source bodies run at an inclined angle with respect to the base surfaces of the bodies.

In a preferred embodiment of the invention, each source comprises a minimum of two bodies and the magnetic lines of force are oriented to run at angles of different inclination.

Figure 1A:
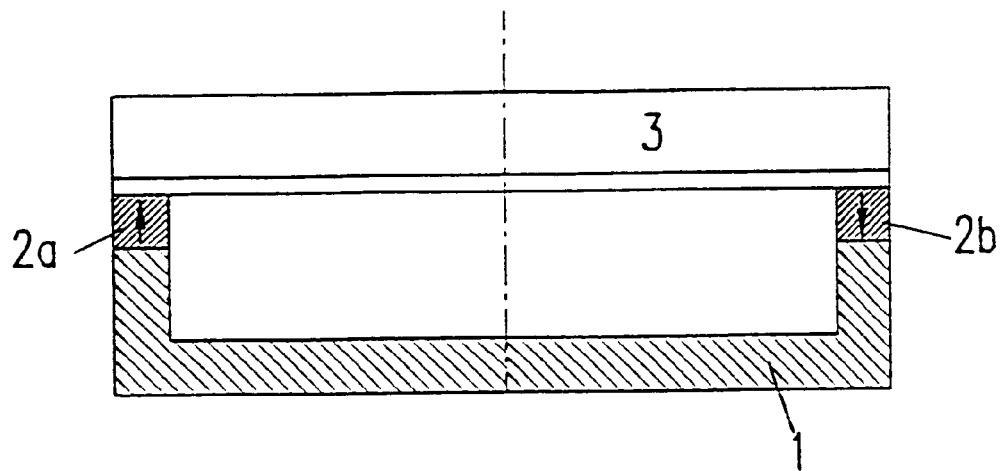
FIG. 1a shows a cross section through a conventional sputtering cathode design.

As a result of this invention, a great variety of different embodiments is possible; two such embodiments are diagrammatically illustrated in the appended drawings. FIG. 1a shows a cross section through a conventional sputtering cathode design, in which the sputtering target comprises rear plate 3, permanent magnets 2a and 2b, and a yoke made of a material of low retentivity 1 for the magnetic return path. In conformity with the present state of technology, the axes or magnetization of the permanent magnets run in parallel vertical but opposite directions with respect to each other, as indicated by the arrows in FIG. 1a.

Figure 1B:
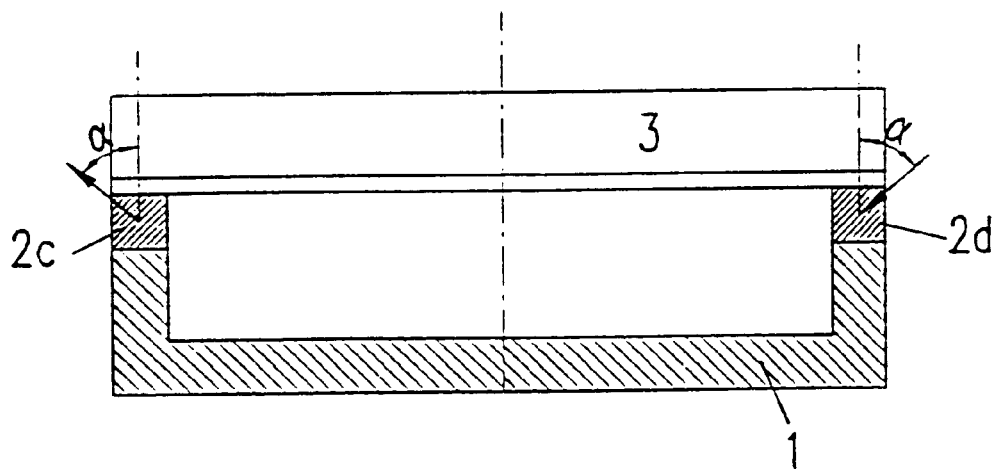
FIG. 1b shows a cross section through a sputtering cathode design according to one embodiment of the present invention.

The utilization of the target material can be improved by rotating the axes of magnetization of permanent magnets 2c and 2d through angle α with respect to the vertical axis, as indicated by FIG. 1b. In each case, the optimum angle of rotation α depends on the properties (e.g., the thickness of the material) of sputtering target 3 and has a direction of rotation relative to the vertical axis which ensures that the lengths of the magnetic lines of force in and/or over the sputtering target are increased. The absolute values of the angles of rotation are, for reasons of symmetry, the same for both magnets of the sputtering cathode (mirror symmetry relative to the central axis of the cathode).

Figure 1C:
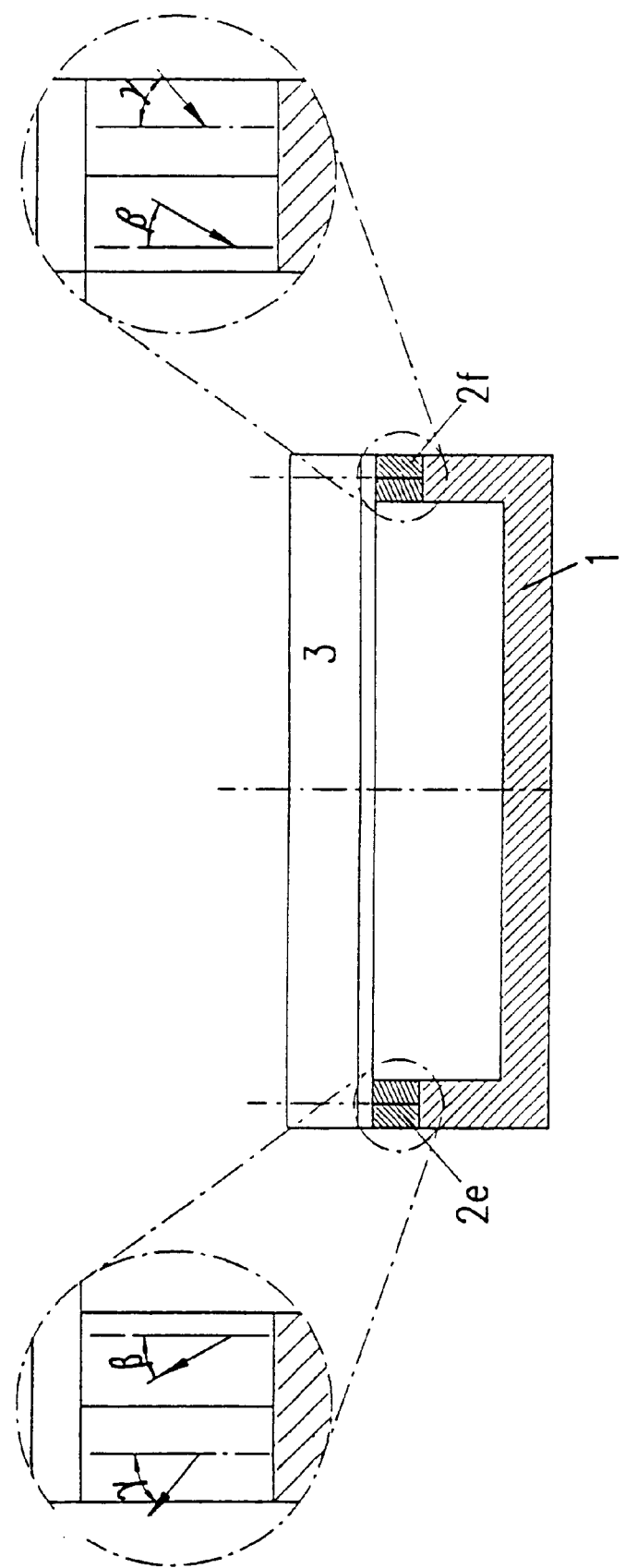
FIG. 1c shows a cross section through a sputtering cathode design according to another embodiment of the present invention, with exploded views of the magnetic sources according to the embodiment.

The target material can also be better utilized by replacing permanent magnets 2a,2b or 2c,2d with two permanent magnets with only half the cross-sectional surface 2e and 2f, as illustrated in FIG. 1c. In contrast to the design shown in FIG. 1b, the axes of magnetization have two different angles of rotation β and γ, with the optimum angles of rotation depending on the properties of the sputtering target. By doubling the number of the angles of rotation, the advantage obtained is that the magnetic field adapts to the sputtering target. The direction of rotation of the two angles of rotation relative to the vertical axis should be selected to ensure that the length of the lines of magnetic force in and/or over the sputtering target are increased, similar to those of the design shown in FIG. 1b. For reasons of symmetry, the absolute values of the angles of rotation of the two permanent magnets, which are located in mirror symmetry relative to the central axis of the sputtering cathode, are the same.

Further modifications and variations of the foregoing will be apparent to those skilled in the art, and are intended to be encompassed by the claims appended hereto.

German priority application 198 19 785.3 is relied upon and incorporated herein by reference in its entirety.

We claim:

1. A sputtering cathode based on the magnetron principle, comprising:

a target material to be sputtered, comprised of one or more components, the target material having an upper surface and a lower surface;

a magnetic system, located adjacent the lower surface of the target material, the magnetic system comprising a pair of magnetic sources of opposite polarity, the magnetic sources having two opposite magnetic poles, which sources are in the form of right prisms having an upper edge and a lower edge, wherein magnetic poles of each of the magnetic sources are oriented at an angle that is not perpendicular to the upper surface of the target material, and wherein the pair of sources forms a self-enclosed tunnel of arcuate magnetic lines of force; wherein the lower edges of the magnetic sources, facing away from the target, are connected via a magnetic yoke made of a material of low retentivity, the upper edges of the magnetic sources run parallel to the target surfaces, and the polarity and thus the magnetic lines of force of the sources run at an inclined angle with respect to a line perpendicular to the upper surface of the target material, whereby the magnetic lines of force leaving the upper edge of the magnetic sources angle away from a center of the sputtering cathode.

2. The sputtering cathode according to claim 1, wherein the magnetic sources in the form of right prisms form parallelepipeds.

3. The sputtering cathode according to claim 1, wherein each magnetic source of the pair comprises at least two magnetic bodies having magnetic lines of force, wherein orientations of the magnetic lines of force of the magnetic bodies run at angles of different inclination with respect to a line extending through a center of the target material and perpendicular to the upper surface of the target material.

4. The sputtering cathode according to claim 2, wherein each magnetic source of the pair comprises at least two magnetic bodies having magnetic lines of force, wherein orientations of the magnetic lines of force of the magnetic bodies run at angles of different inclination with respect to a line extending through a center of the target material and perpendicular to the upper surface of the target material.

5. A sputtering cathode based on the magnetron principle, comprising:

a target material to be sputtered having an upper surface and a lower surface;

a magnetic system, located adjacent the lower surface of the target material, the magnetic system comprising a pair of bipolar magnetic sources in the form of right prisms oriented with opposite polarities, each of the magnetic sources having an upper edge and a lower edge, wherein the upper edge of each source is located adjacent the lower surface of the target material, and wherein magnetic poles of each of the magnetic sources are oriented at an angle that is not perpendicular to the upper surface of the target, such that the pair of sources forms a self-enclosed tunnel of arcuate magnetic lines of force that extend away from a center of the upper surface of the target material and over the upper surface of the target material; and a magnetic yoke made of a material of low retentivity connecting the lower edges of the magnetic sources.

6. The sputtering cathode according to claim 5, wherein the magnetic sources in the form of right prisms form parallelepipeds.

7. The sputtering cathode according to claim 6, wherein each magnetic source of the pair comprises at least two magnetic bodies having magnetic lines of force, wherein orientations of the magnetic lines of force of the magnetic bodies run at angles of different inclination with respect to a line extending through a center of the target material and perpendicular to the upper surface of the target material.

8. The sputtering cathode according to claim 5, wherein each magnetic source of the pair comprises at least two magnetic bodies having magnetic lines of force, wherein orientations of the magnetic lines of force of the magnetic bodies run at angles of different inclination with respect to a line extending through a center of the target material and perpendicular to the upper surface of the target material.

9. A sputtering cathode based on the magnetron principle, comprising:

a target material to be sputtered, the target having a first surface, a second surface opposite the first surface, a first side, and a second side opposite the first side;

a magnetic system, located adjacent the second surface of the target material, the magnetic system comprising:

a first magnetic source located at the first side of the target material, wherein the first magnetic source is in the form of a right prism having a first edge and a second edge, wherein the first edge of the first magnetic source is located adjacent the second surface of the target material, and wherein magnetic poles of the first magnetic source are oriented at an angle that is not perpendicular to the first surface of the target material and at an angle that is not perpendicular to the first and second edges of the first magnetic source, and a second magnetic source located at the second side of the target material, wherein the second magnetic source is in the form of a right prism having a first edge and a second edge, wherein the first edge of the second magnetic source is located adjacent the second surface of the target material, wherein magnetic poles of the second magnetic source are oriented at an angle that is not perpendicular to the first surface of the target material and at an angle that is not perpendicular to the first and second edges of the second magnetic source, and wherein the magnetic poles of the second magnetic source are oriented opposite to the magnetic poles of the first magnetic source, wherein the magnetic poles of the first and second magnetic sources are oriented such that lines of magnetic force from the first and second magnetic sources form a self-enclosed tunnel of arcuate magnetic lines of force that extend away from a center of the first surface of the target material and over the first surface of the target material; and a magnetic yoke made of a material of low retentivity connecting the second edge of the first magnetic source and the second edge of the second magnetic source.

10. The sputtering cathode according to claim 9, wherein the first magnetic source is in the form of a parallelepiped.

11. The sputtering cathode according to claim 10, wherein the second magnetic source is in the form of a parallelepiped.

12. The sputtering cathode according to claim 9, wherein the first magnetic source includes a first magnetic body and a second magnetic body, wherein magnetic poles of the first magnetic body are oriented such that magnetic lines of force run from the first magnetic body away from the center of the first surface of the target material at a first angle, and wherein magnetic poles of the second magnetic body are oriented such that magnetic lines of force run from the second magnetic body away from the center of the first surface of the target material at a second angle, wherein the first angle is different from the second angle.

13. The sputtering cathode according to claim 12, wherein the second magnetic source includes a first magnetic body and a second magnetic body, wherein magnetic poles of the first magnetic body of the second magnetic source are oriented opposite the magnetic poles of the first magnetic body of the first magnetic source, and wherein magnetic poles of the second magnetic body of the second magnetic source are oriented opposite the magnetic poles of the second magnetic body of the second magnetic source.

* * * * *